(12) United States Patent
Wright et al.

(10) Patent No.: US 9,627,820 B2
(45) Date of Patent: Apr. 18, 2017

(54) POWER ENTRY AND DISTRIBUTION FOR NETWORK PROCESSING SYSTEMS

(71) Applicant: Anue Systems, Inc., Austin, TX (US)

(72) Inventors: Cary J. Wright, Austin, TX (US); Kevin R. Garrett, Austin, TX (US); Christopher C. Ott, Austin, TX (US)

(73) Assignee: Anue Systems, Inc., Austin, TX (US)

( * ) Notice: Subject to any disclaimer, the term of this patent is extended or adjusted under 35 U.S.C. 154(b) by 387 days.

(21) Appl. No.: 14/136,225

(22) Filed: Dec. 20, 2013

(65) Prior Publication Data

US 2015/0181757 A1 Jun. 25, 2015

(51) Int. Cl.

| | |
|---|---|
| *G06F 1/16* | (2006.01) |
| *H05K 5/00* | (2006.01) |
| *H05K 7/00* | (2006.01) |
| *H01R 13/68* | (2011.01) |
| *H01R 13/502* | (2006.01) |
| *H05K 7/14* | (2006.01) |
| *H05K 7/20* | (2006.01) |

(52) U.S. Cl.
CPC ........... *H01R 13/68* (2013.01); *H01R 13/502* (2013.01); *H05K 7/1457* (2013.01); *H05K 7/20581* (2013.01)

(58) Field of Classification Search
CPC ...................................................... H01R 13/68
USPC .................................. 361/690–692, 694–697
See application file for complete search history.

(56) References Cited

U.S. PATENT DOCUMENTS

| | | | |
|---|---|---|---|
| 4,060,303 A | 11/1977 | Wilczynski | |
| 5,299,088 A | 3/1994 | Honl et al. | |
| 5,971,804 A * | 10/1999 | Gallagher | G06F 1/189 333/238 |
| 7,339,786 B2 * | 3/2008 | Bottom | H04L 49/351 361/679.41 |
| 7,619,902 B2 | 11/2009 | Buchbender et al. | |
| 7,719,834 B2 * | 5/2010 | Miyamoto | G06F 1/187 312/223.2 |
| 7,864,519 B2 * | 1/2011 | Lin | G11B 33/128 361/679.33 |
| 7,978,482 B2 | 7/2011 | Mason | |
| 7,995,329 B2 | 8/2011 | Coffey et al. | |
| 9,274,548 B2 * | 3/2016 | Foisy | G06F 1/16 |
| 2004/0152360 A1 | 8/2004 | Harris et al. | |

* cited by examiner

*Primary Examiner* — Anthony Haughton
(74) *Attorney, Agent, or Firm* — Egan Peterman Enders Huston

(57) ABSTRACT

Power entry and distribution for network communication systems are disclosed. For certain embodiments depicted, a power distribution board with an open-grid configuration receives power feed/return lines from a power entry connector and distributes the power feed/return lines for a network processing system. The open-grid configuration facilitates airflow through a chassis and thereby provides improved cooling. Further, a modular power entry connector can be used to facilitate connection of power feed/return cables to the chassis for the network processing systems while improving safety for high power implementations.

21 Claims, 6 Drawing Sheets

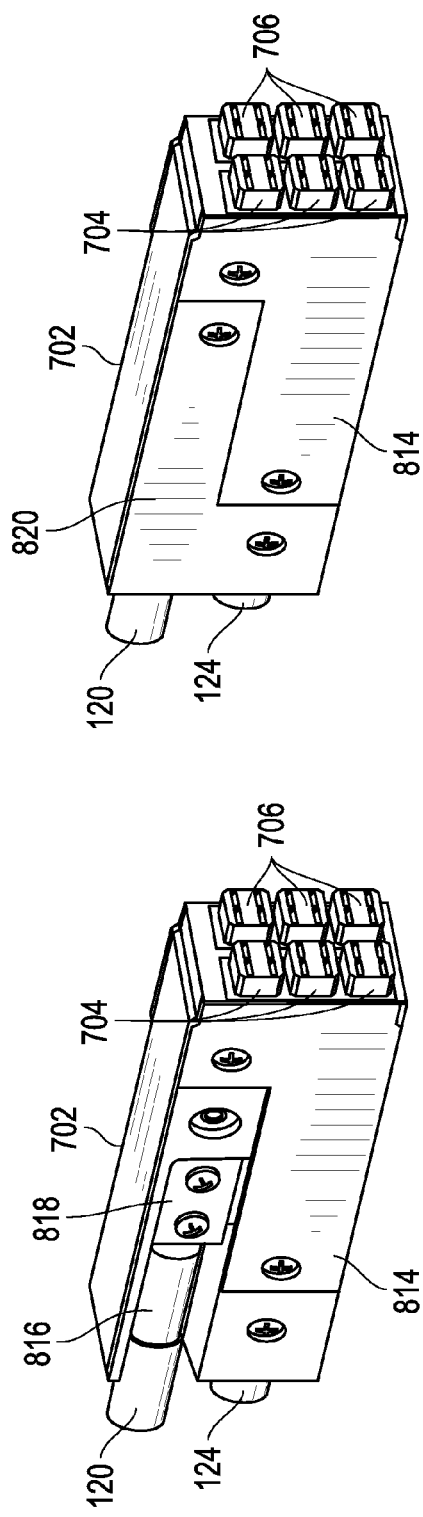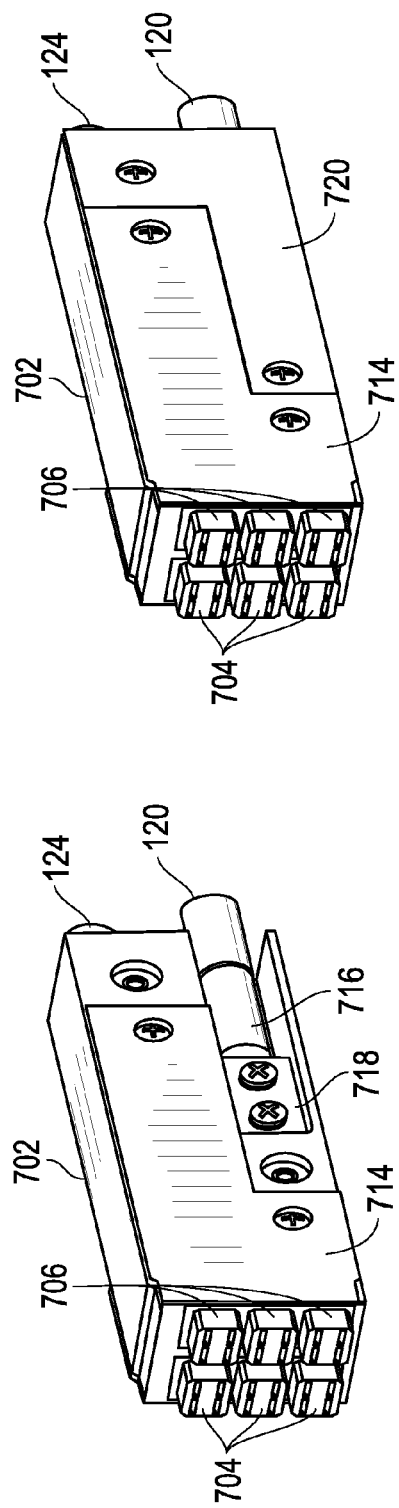

POWER ENTRY AND DISTRIBUTION FOR NETWORK PROCESSING SYSTEMS

TECHNICAL FIELD

This disclosed embodiments relate to high power entry and internal power distribution for network processing systems.

BACKGROUND

Power is required for network processing systems, and these power requirements can be significant where a large amount of network processing circuitry is included within a network processing system. Further, airflow is often used to cool network processing systems that have high power requirements.

FIG. 1 (Prior Art) is a block diagram of an embodiment 100 for a prior network processing system having brackets 122 and 126 for power entry. An insulated power feed cable 120 has an internal conductor that is bolted to the rear side of a chassis 102 using bracket 124, and insulated power return cable 124 has an internal conductor that is bolted to the rear side of a chassis 102 using bracket 126. As shown by arrows 108/110, the airflow generated by the fan assembly 104 is pulled into the front of chassis 102, passes from the top part of chassis 102 through the network processing circuitry 106 into the bottom part of chassis 102, and exits the rear of chassis 102. It is noted that the fan assembly 104 can also be configured to push air through the chassis 102 rather than pull air through the chassis 102 as shown in FIG. 1. The airflow would then travel the opposite direction from the direction shown in FIG. 1.

The power entry provided by brackets 122/126 is cumbersome because screws that secure the brackets 122/126 to the chassis 102 must be accessed by technicians managing the network processing system. In addition, as high power is being fed and returned by cables 120/124, the relative ease that conductive brackets 122/126 can be touched by the technician or a tool creates safety problems. Further, fuses associated with the power entry brackets 122/126 will typically be placed within the chassis 102, and this placement can make it difficult to access the fuses. Still further, because the brackets 122/126 are secured to the back of the chassis 102, the power feed/return cables 120/124 will tend to pass over the fan assembly 104 and interfere with airflow through the chassis 102. Even if the connection locations for brackets 122/126 are moved to avoid interference with fan assembly 104, the power feed/return cables 120/124 will still tend to interfere with another chassis below or above chassis 102 when multiple network processing systems are stacked, for example, within a rack. Further, this configuration requires increased rack spacing between multiple stacked modules within a rack and make more difficult the removal/insertion of various modules within a rack.

SUMMARY OF THE DISCLOSED EMBODIMENTS

Power entry and distribution for network communication systems are disclosed. For certain embodiments depicted, a power distribution board with an open-grid configuration receives power feed/return lines from a power entry connector and distributes the power feed/return lines for a network processing system. The open-grid configuration facilitates airflow through a chassis and thereby provides improved cooling. Further, a modular power entry connector can be used to facilitate connection of power feed/return cables to the chassis for the network processing systems while improving safety for high power implementations. Other features and variations can be implemented, and related systems and methods can be utilized, as well.

For one disclosed embodiment, a network processing system assembly includes a chassis, a power connector coupled to the chassis and configured to receive a power entry connector, a power drop board coupled to the power connector and having a plurality power couplers, and a power distribution board coupled to the chassis and configured as an open grid structure having board regions and open regions. The power distribution board further includes a plurality of power input connectors coupled to the plurality of power couplers for the power drop board and a plurality of power output ports coupled to the plurality of power input connectors. In addition, the open regions include at least forty percent of a planar surface area for the power distribution board, and the power distribution board is positioned within the chassis such that the open regions allow airflow to pass from a first internal portion of the chassis to a second internal portion of the chassis. In other embodiments, the open regions include at least seventy percent of the planar surface area for the power distribution board. Still further, the open grid structure can also include rectilinear board segments or curved board segments or both.

In further embodiments, the network processing system assembly includes a fan subsystem coupled to the chassis to facilitate airflow through the chassis and the power distribution board. In addition, the power distribution board can be secured within the chassis perpendicular to an airflow direction for the fan subsystem. Still further, the power distribution board can be configured to help registration of one or more additional circuit boards. A conductive cage can also be coupled to the power drop board, the conductive cage being configured to provide electro-magnetic shielding for the power connector. The power distribution board can also have power output ports on two opposing surfaces. The network processing system can also include at least one additional power drop board coupled to the power distribution board and to at least one additional power connector where the additional power drop board is configured to provide redundant power supply.

In still further embodiments, the power entry connector can be a modular power entry connector comprising a plurality of components. The modular power entry connector can also include a recess configured to receive a first power cable, a recess configured to receive a second power cable, and insulating plates configured to cover the cable recesses. Further, the first power cable can be a power feed cable; the second power cable can be a power return cable; and the modular power entry connector can further include a recess configured to receive a power feed fuse, a recess configured to receive a power return fuse, and additional insulating plates configured to cover the fuse recesses. Still further, the insulating plates for the cable recesses and the additional insulating plates for the fuse recesses can be removably coupled to a connector body for the modular power entry connector. In addition, the modular power entry connector can be shaped to fit within a recess within the chassis. Also, the assembly can further include a conductive cage coupled to the power drop board and configured to receive the modular power entry connector, and the conductive cage can be configured to provide electro-magnetic shielding for the modular power entry connector.

For another disclosed embodiment, a modular power entry connector assembly includes a connector body, a first recess within the connector body configured to receive a first power cable, a second recess within the connector body configured to receive a second power cable, a first insulating plate configured to cover the first recess, and a second insulating plate configured to cover the second recess, where the first and second insulating plates are configured to conform to an outer surface of the connector body.

In further embodiments, the modular power entry connector assembly can also include a third recess within the connector body, a first fuse for the power feed cable coupled to the connector body within the third recess, a third insulating plate configured to cover the third recess, a fourth recess within the connector body, a second fuse for the power return cable coupled to the connector body within the fourth recess, and a fourth insulating plate configured to cover the fourth recess, where the third and fourth insulating plates are configured to conform to an outer surface of the connector body.

In still further embodiments, the first power cable can be a power feed cable and the second power cable is a power return cable. In addition, the third and fourth insulating plates can be removably coupled to the connector body. Also, each of the insulating plates can be removably coupled to the connector body. Further, the first and second power cables and the first and second fuses can be configured to allow current flows of 40 Amps or more. Still further, the connector body can be elongated in one direction and wherein the first and second power cables are configured to exit the connector body aligned with this direction.

Other features and variations can be implemented, if desired, and related systems and methods can be utilized, as well.

DESCRIPTION OF THE DRAWINGS

It is noted that the appended drawings illustrate only exemplary embodiments and are, therefore, not to be considered limiting of the scope of the invention, for the invention may admit to other equally effective embodiments.

FIGS. 8A-D are perspective diagrams for a completed modular power entry connector with and without customer insulating cover plates removed.

DETAILED DESCRIPTION

Power entry and distribution for network communication systems are disclosed. For certain embodiments depicted, a power distribution board with an open-grid configuration receives power feed/return lines from a power entry connector and distributes the power feed/return lines for a network processing system. The open-grid configuration facilitates airflow through a chassis and thereby provides improved cooling. Further, a modular power entry connector can be used to facilitate connection of power feed/return cables to the chassis for the network processing systems while improving safety for high power implementations. Other features and variations can be implemented, and related systems and methods can be utilized, as well.

Figure 1:
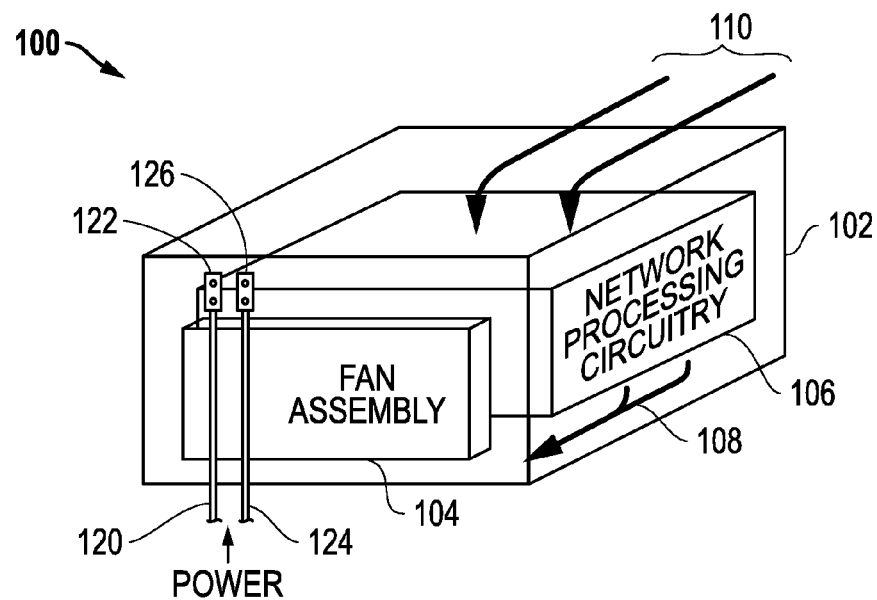
FIG. 1 (Prior Art) is a block diagram of an embodiment for a prior network processing system having brackets that secure cables for power entry.
Figure 2:
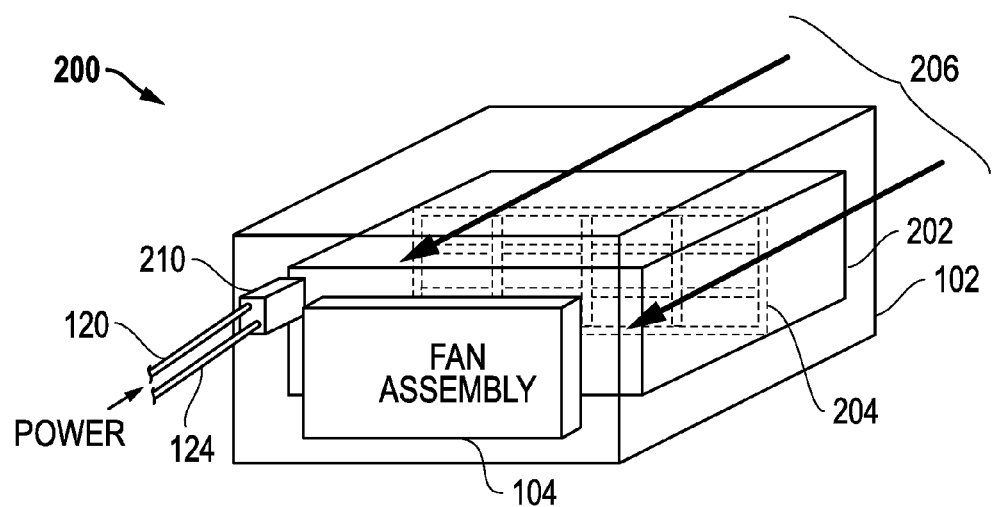
FIG. 2 is a block diagram of an embodiment for a network processing system having improved power entry including a modular power entry connector and a power distribution board having an open grid configuration.

FIG. 2 is a block diagram of an embodiment 200 for a network processing system having improved power entry including a modular power entry connector 210 and a power distribution board 204 having an open grid configuration. As with embodiment 100 of FIG. 1 (Prior Art), the network processing system includes a chassis 102 and a fan assembly 104. In contrast with embodiment 100, a modular power entry connector 210 is used for power entry. Insulated power feed cable 120 and insulated power return cable 124 each have an internal conductor that is secured within modular power entry connector 210, and modular power entry connector 210 is inserted and mated to internal power connectors within the rear side of chassis 102. Within the chassis 102, power is distributed from the modular power entry connector 210 to network processing circuitry 202 using a power distribution board 204 that has an open grid configuration. Because the power distribution board 204 has an open grid configuration, airflow is allowed to pass relatively freely from one side of the power distribution board 204 to the other side of the power distribution board 204. Thus, as shown by arrows 206, the airflow generated by the fan assembly 104 is pulled into the front of chassis 102, passes directly through the open regions of the power distribution board 204, and exits the rear of chassis 102. It is again noted that the fan assembly 104 can also be configured to push air through the chassis 102 rather than pull air through the chassis 102, as shown in FIG. 2.

Advantageously, the power entry provided by modular power entry connector 210 allows for the power cables 120/124 to be easily connected to internal power connectors within the chassis 102. Further, the power cables 120/124 can be configured to exit away from the chassis 102 without interfering with airflow through the fan assembly 104. As depicted, the power cables 120/124 extend in a perpendicular direction from the back surface of the chassis 102. This orientation also allows reduced rack spacing between multiple stacked modules within a rack and facilitates the removal/insertion of various modules within a rack. Further, by distributing internal power using the open-grid power distribution board 204, improved airflow is provided through the network processing circuitry 202 within the chassis 102. It is noted that while the open grid configuration is shown as a rectilinear configuration with ninety degree angles between board segments, the board segments can also be connected using other angles, and the board segments can be configured as curved segments in addition to or instead of straight line segments. It is further noted that more open areas allow more air to flow through the power distribution board 204 but limits an amount of board space available to route power to different power output ports on the power distribution board. As such, a trade-off is made between open regions and board regions. It is noted that the ratio of open regions to board regions for the power distribution board 204 can preferably be at least 40 percent or more open regions and can more preferably be at least 70 percent or more open regions.

FIGS. 3-6 provide further views for example embodiments for the power distribution board 204. FIGS. 7 and 8A-D provide further views of example embodiments for the modular power entry connector 210. Variations to these example embodiments could be implemented, as desired, while still utilizing the modular power entry and open-grid power distribution techniques described herein.

Figure 3:
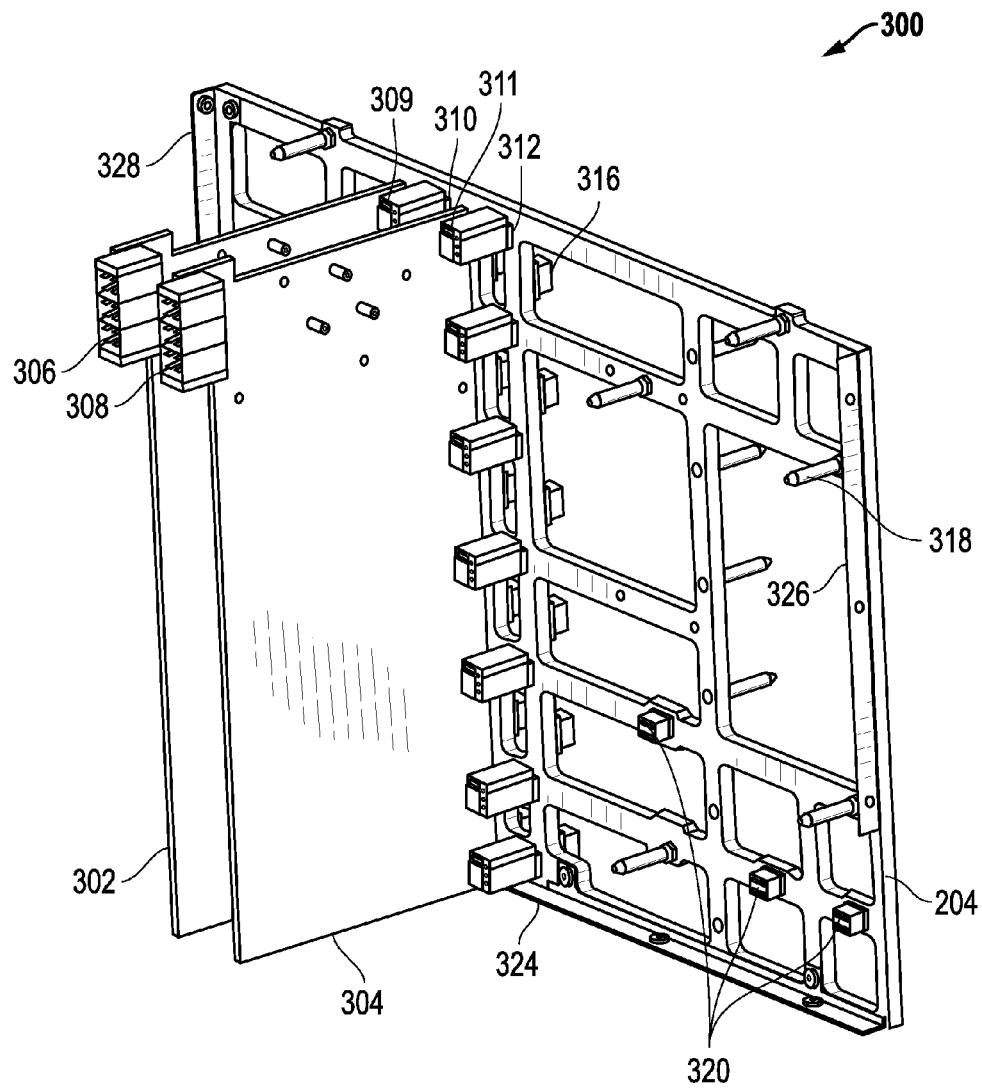
FIG. 3 is a perspective view diagram of an embodiment for a power distribution board coupled to power drop boards within a chassis.

FIG. 3 is a perspective view diagram of an embodiment 300 for a power distribution board 204 coupled to power drop boards 302 and 304 within a chassis 102. The internal power connector 306 is configured to receive a first modular power entry connector 210. To provide redundant power supply, a second internal power connector 308 is configured to receive a second modular power entry connector 210. The power drop board 302 routes feed and return power lines associated with internal power connector 306 to each of a plurality of couplers 309 that run along the edge of the power drop board 302. These power couplers 309 connect to input power ports 310 on the power distribution board 204. Similarly, the power drop board 304 routes redundant feed and return power lines associated with internal power connector 308 to each of a plurality of couplers 311 that run along the edge of power drop board 304. These power couplers 311 connect to input power ports 312 on the power distribution board 204. For the example embodiment 300 depicted, seven couplers 309/311 and seven input power ports 310/312 are used. Other numbers and variations could also be implemented.

The power distribution board 204 routes feed and return power lines to a plurality of output power ports 314 that are associated with power drop board 302 and that face away from the opposite surface of the power distribution board 204. Similarly, the power distribution board 204 routes feed and return power lines to a plurality of redundant output power ports 316 that are associated with power drop board 304 and that face away from the opposite surface of the power distribution board 204. One or more additional circuit boards including network processing circuitry can be coupled to the output power ports 314/316 and can receive power from these output power ports 314/316. The power distribution board 204 can also be configured to route feed and return power lines to one or more additional output power ports 320 that can be positioned on either side or both sides of the power distribution board 204. These additional output power ports can be used to supply power to other network processing circuitry included within chassis 102, as desired. Further, one or more spacers 318 can be provided in various selected locations on either side or both sides of the power distribution board 204 to provide further mechanical support and spacing for other circuitry and circuit boards coupled to the power distribution board 204. Still further, one or more flanges 324, 326, and 328 can be used to secure the power distribution board 204 to the chassis 102 using screws or some other securing technique. It is further noted that the power distribution board 204 and the power drop boards 302/304 can be implemented using printed circuit boards (PCBs) that have conductive metal traces configured to provide desired power routing lines.

The power distribution board 204 can be further configured to facilitate registration (e.g., pre-determined placement) of additional circuit boards with respect to the power distribution board 204. For example, the output power ports 314/316/320 and the spacers 318, as well as other features of the power distribution board 204, can be configured to facilitate the positioning of additional circuit boards in particularly pre-determined locations and orientations with respect to the power distribution board 204 once these circuit boards are secured in place. The spacers 318 can be used to connect to and support such additional circuit boards.

Figure 4:
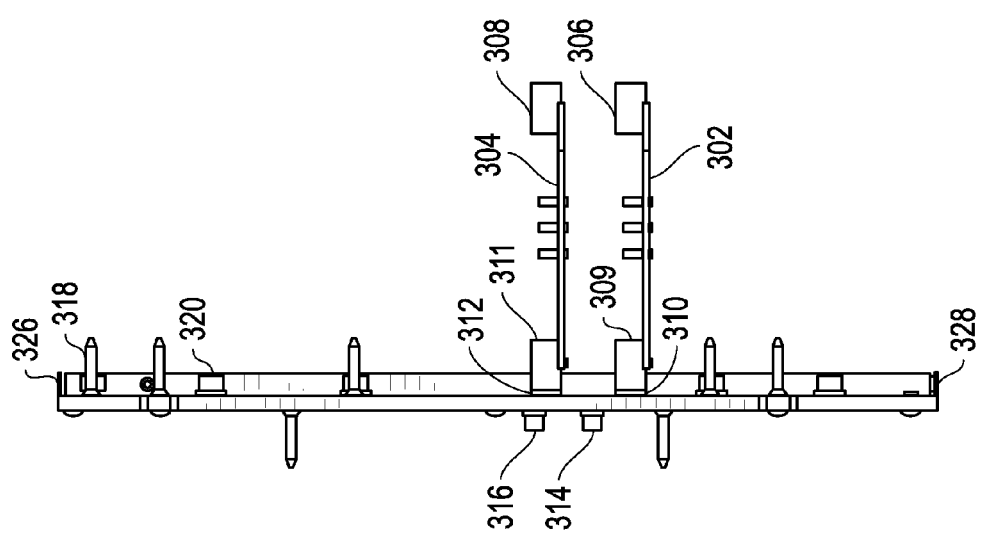
FIG. 4 is a top view diagram for the power distribution board and power drop boards.

FIG. 4 is a top view diagram of embodiment 300 for power distribution board 204 and power drop boards 302/324. The internal power connectors 306/308 are coupled to power drop boards 302/304. Power couplers 309/311 are connected to input power ports 310/312. Output power ports 314/316 face outward from the opposite surface of power distribution board 204. Additional output power ports 320 are also provided, as well as spacers 318 and connection flanges 326/328. As shown, the power drop boards 302/304 can be configured to extend in a plane perpendicular to the plane for power distribution board 204.

Figure 5:
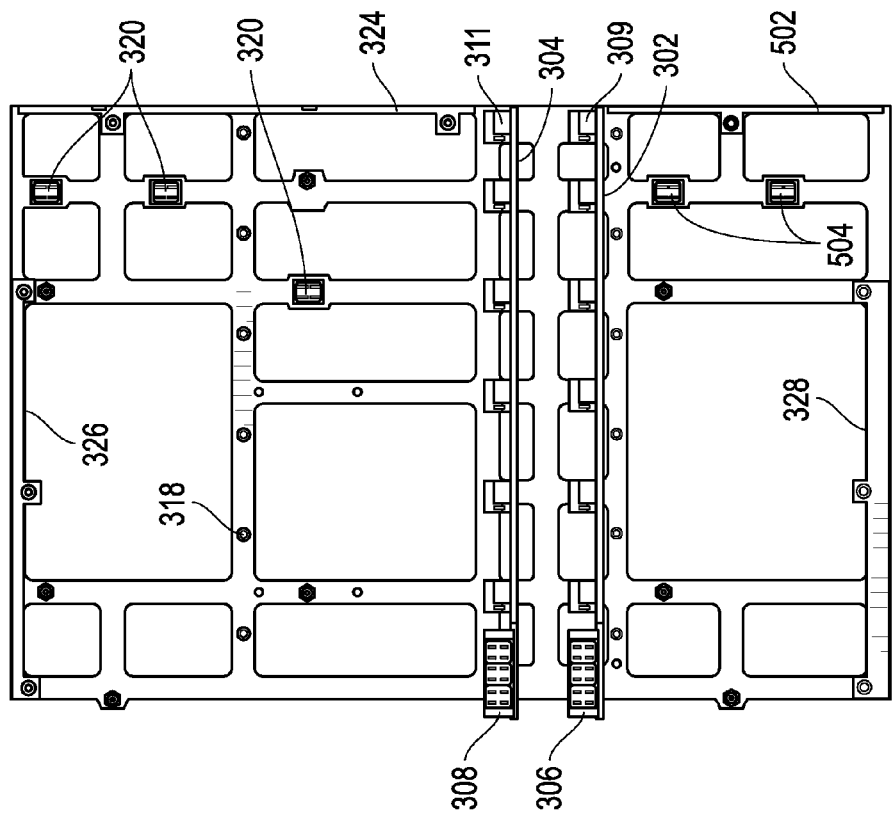
FIG. 5 is a rear view diagram for the power distribution board and power drop boards.

FIG. 5 is a rear view diagram of embodiment 300 for power distribution board 204 and power drop boards 302/304. The internal power connectors 306/308 are coupled to power drop boards 302/304. Power couplers 309/311 are connected to input power ports 310/312 (not seen). Additional output power ports 320 are also provided, as well as spacers 318 and connection flanges 324/326/328. Also seen in FIG. 5 are two additional power output ports 504 as well as an additional connection flange 502. As shown, the power drop boards 302/304 can be configured to extend in a plane perpendicular to the plane for power distribution board 204.

Figure 6:
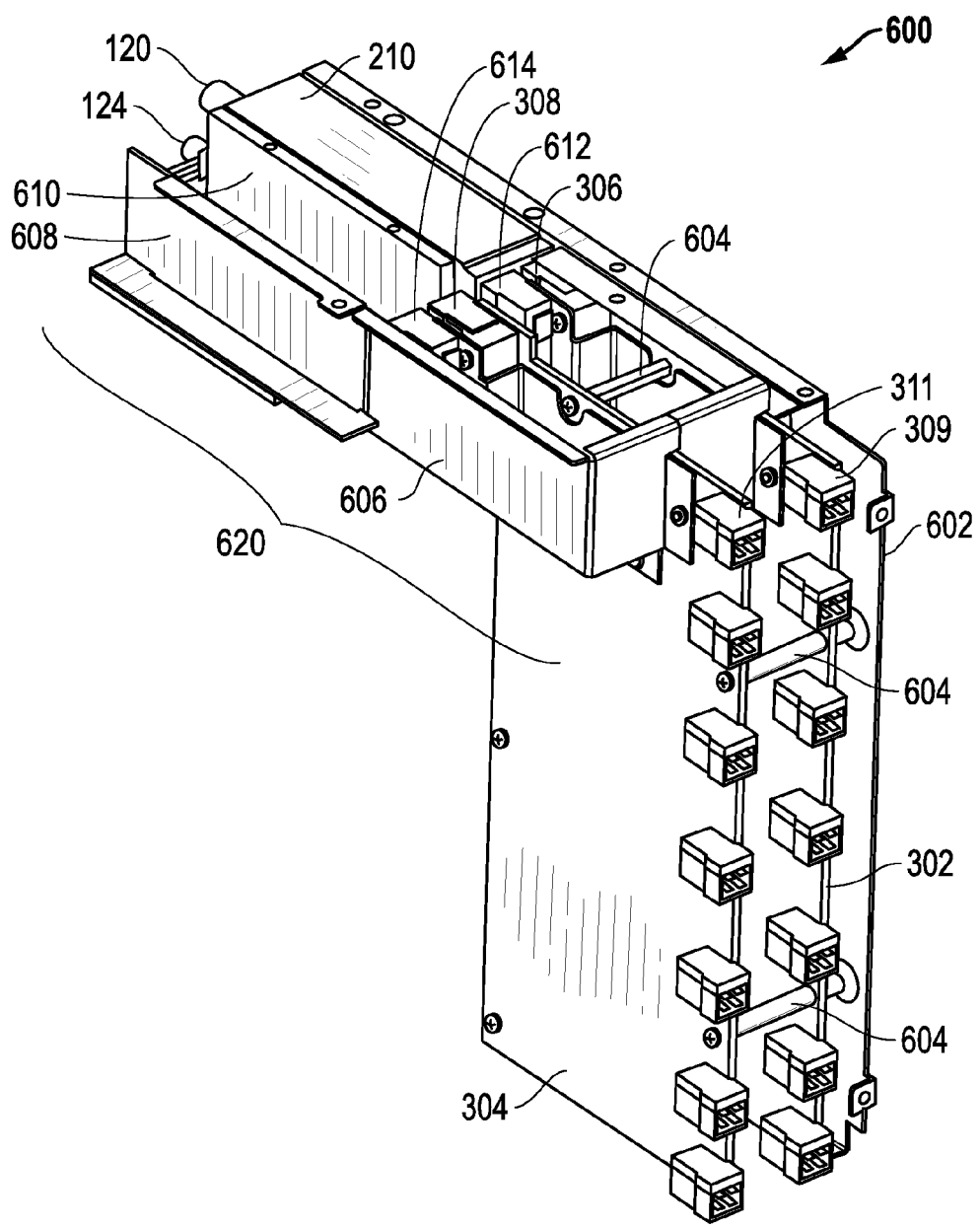
FIG. 6 is a perspective view of an embodiment for power drop boards and a metal cage assembly configured to receive the modular power entry connector.

FIG. 6 is a perspective view of an embodiment 600 for power drop boards 302/304 and a metal cage assembly 620 configured to receive the modular power entry connector 210. The power drop boards 302/304 are connected to a support structure 602 that has one or more spacers 604 connected to the power drop boards 302/304. The metal cage assembly 620 provides electro-magnetic shielding for the circuitry that brings power into the system. The metal cage assembly 620 includes a first metal shield cage 606 that shields the internal power connector 306/308 and a second metal shield cage 608 that shields the modular power entry connector 210 once inserted into the chassis 102. A metal divider 610 is positioned within the metal shield cage 608 to form two compartments with one configured to receive the modular power connecter 210 and the other configured to receive a second modular power entry connector. Two or more modular power entry connectors can be used to provide redundant power supply. For the embodiment 600 depicted, each of the internal power connectors 306 and 308 is paired with an additional power connector 612 and 614, respectively. One of the paired internal power connectors can be used to receive the power feed and the other can be used to provide the power return. The modular power entry connector 210 slides into one of the compartments within metal shield cage 608, and an additional modular power entry connector 210 can slide into the other compartment within the shield cage 608. Once inserted into the cage 608 within chassis 102, the modular power entry connectors 210 connect to the internal power connectors 306/308/612/614. As described above, the power drop boards 302/304 distribute power feed lines and power return lines to the power couplers 309/311 as described above.

It is also noted that although power drop boards 302/304 are configured to carry power feed lines and return lines with a single power entry connector 210 for each board, the power drop boards could also be implemented using different configurations. For example, the power drop boards could be implemented using feed-only boards and return-only boards, if desired. Further, the power drop boards can provide one or more feed/return paths depending upon the implementation selected. Further, additional segments can be provided in the shield configurations as needed, and additional connectors can be used to provide the corresponding feed/return lines. Similarly, the modular power entry connector 210 can be configured as supply-only to provide supply voltage, return-only to provide return paths, or provide both supply and return voltage paths. Other feed/return configurations could also be utilized while still taking advantage of the modular power entry connectors as described herein.

Figure 7:
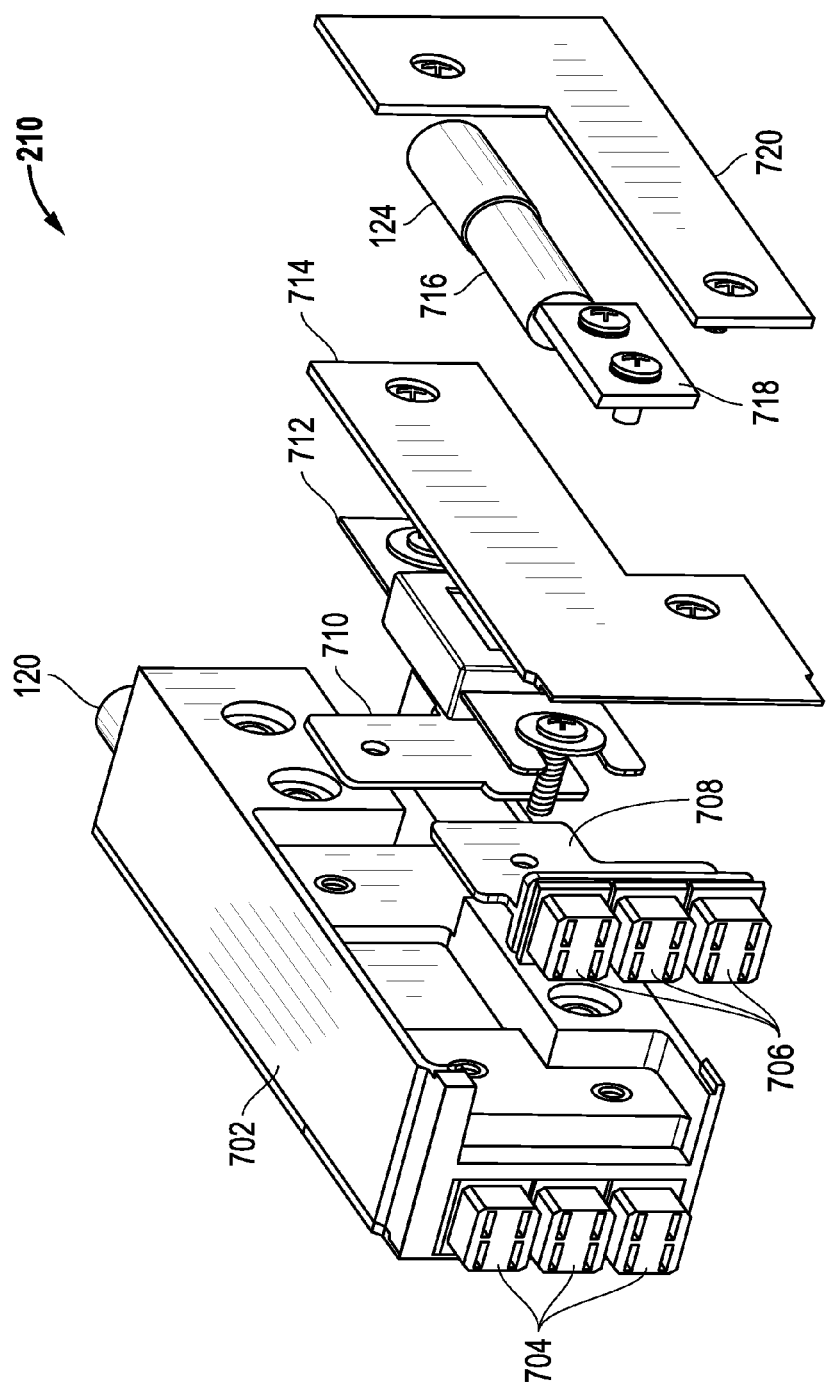
FIG. 7 is an exploded view for one side of an embodiment for modular power entry connector.

Looking now in more detail to the modular power entry connector 210, FIG. 7 provides an exploded view for one side of an embodiment for modular power entry connector 210. A connector body 702 is formed with one or more recesses that are configured to receive the various pieces of the assembly, as described herein. Power return connectors 706 for the modular power entry connector 210 are connected to a conductive plate 708. This conductive plate 708 and conductive plate 710 are secured into a recess within connector body 702 with screws that also secure fuse 712 to the connector body 702. Once secured, the fuse 712 is within the electrical path between the conductive plates 708/710. The insulated power return cable 124 has a conductive lug connector 716 with a conductive bracket 718 that is crimped onto a conductor within the power return cable 124. The conductive bracket 718 for lug 716 is secured to a recess within the connector body using screws and will overlap and contact the conductive plate 710. As such, once assembled, a conductive path exists between the conductor within the power return cable 124 and the power return connectors 706 through the fuse 712, plates 708/710, and lug 716. An insulating cover plate 714 is secured to the connector body 702 using screws and covers the fuse 712, the plate 708, and a portion of the plate 710. A separate insulating plate 720 is also secured to the conductor body using screws and covers the non-insulated conductor 716 and the bracket 718. Although not shown, the power feed cable 120 is secured to the connector body 702 with similar structures as shown for power return conductor 124. As such, a conductive path exists between the conductor for the power feed cable 120 and the power feed connectors 704 through a fuse, conductive plates, and a conductive lug.

Advantageously, the embodiment shown for the modular power entry connector 210 in FIG. 7 has insulated cover plates that protect a user from power being delivered by the modular power entry connector 210. For example, the modular power entry connector 210 can be configured to provide high power, such as currents of 40 Amps or more to the network processing system. At these high currents, accidental contact with conducting portions of the power cables or power entry structures can be dangerous. Further, the modular power entry connector 210 is shaped and configured with smooth planar surfaces so that it is easily inserted within the shield cage 608. For example, the insulating plates for the fuses and power cables can be configured to conform to the outer surface of the connector body to provide a smooth surface that easily engages with a recess within the chassis 102. Further, the resulting modular power entry connector 210 allows a user to easily secure power cables to the modular power entry connector 210 by removing the insulating plates for the power cables, such as plate 720. In addition, the fuses are also easily accessible by removing the insulating plates for the fuses, such as insulating plate 714. Still further, it is noted that while screws are shown as being used to secure the various components to the connector body 210, other securing mechanisms could also be utilized. It is also noted that the fuse 712 can be implemented in a variety of ways, including as a metal bar that extends between two conductors. Other variations could also be implemented, as desired.

FIGS. 8A-D are perspective diagrams for a completed modular power entry connector 210 with and without insulating cover plates 720/820 removed. For FIG. 8A, the non-insulated conductor 816 for the power feed cable 120 is secured to the connector body 702 with conductive bracket 818. An insulating plate 814 covers a fuse. For FIG. 8B, an insulating plate 820 has been secured to cover the non-insulated conductor 816 and the bracket 818. For FIG. 8C, the non-insulated conductor 716 for the power return cable 124 is secured to the connector body 702 with conductive bracket 718. The insulating plate 714 covers a fuse. For FIG. 8D, the insulating plate 720 has been secured to cover the non-insulated conductor 716 and the bracket 718. It is noted that the modular power entry connector 210 could also be overmolded, if desired, to prevent tampering. For example, the connector assembly can be overmolded after the fuse is installed, after the cables are installed, or both. Other variations could also be implemented, as desired, that do not use removable insulating cover plates.

Further modifications and alternative embodiments will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the example embodiments. Various changes may be made in the implementations and architectures described herein. For example, equivalent elements may be substituted for those illustrated and described herein, and certain features of the embodiments may be utilized independently of the use of other features, as would be apparent to one skilled in the art after having the benefit of this description.

What is claimed is:

1. A processing system assembly, comprising:
    a chassis;
    a power connector coupled to the chassis and configured to receive a power entry connector;
    a power drop board coupled to the power connector and having a plurality power couplers; and
    a power distribution board coupled to the chassis and configured as an open grid structure having board regions and open regions, the power distribution board comprising:
        a plurality of power input connectors coupled to the plurality of power couplers for the power drop board; and
        a plurality of power output ports coupled to the plurality of power input connectors;
    wherein the open regions comprise at least forty percent of a planar surface area for the power distribution board;
    wherein the power distribution board is positioned within the chassis such that the open regions allow airflow to pass from a first internal portion of the chassis to a second internal portion of the chassis, the power distribution board being perpendicular to the airflow; and
    wherein the power drop board is configured to extend in a plane perpendicular to a plane for the power distribution board.

2. The processing system assembly of claim 1, wherein the open regions comprise at least seventy percent of the planar surface area for the power distribution board.

3. The processing system assembly of claim 1, further comprising a fan subsystem coupled to the chassis to facilitate airflow through the chassis and the power distribution board.

4. The processing system assembly of claim 1, wherein the power distribution board is configured to help registration of one or more additional circuit boards.

5. The processing system assembly of claim 1, further comprising a conductive cage coupled to the power drop board, the conductive cage being configured to provide electro-magnetic shielding for the power connector.

6. The processing system assembly of claim 1, further comprising at least one additional power drop board coupled to the power distribution board and to at least one additional power connector, the additional power drop board being configured to provide redundant power supply.

7. The processing system assembly of claim 1, wherein the power distribution board has power output ports on two opposing surfaces.

8. The processing system assembly of claim 1, wherein the open grid structure comprises rectilinear board segments or curved board segments or both.

9. The processing system assembly of claim 1, wherein the power entry connector comprises a modular power entry connector comprising a plurality of components.

10. The processing system assembly of claim 9, wherein the modular power entry connector comprises a recess configured to receive a first power cable, a recess configured to receive a second power cable, and insulating plates configured to cover the cable recesses.

11. The processing system assembly of claim 10, wherein the first power cable is a power feed cable, wherein the second power cable is a power return cable, and wherein the modular power entry connector further comprises a recess configured to receive a power feed fuse, a recess configured to receive a power return fuse, and additional insulating plates configured to cover the fuse recesses.

12. The processing system assembly of claim 10, wherein the insulating plates for the cable recesses and the additional insulating plates for the fuse recesses are removably coupled to a connector body for the modular power entry connector.

13. The processing system assembly of claim 9, wherein the modular power entry connector is shaped to fit within a recess within the chassis.

14. The processing system assembly of claim 13, further comprising a conductive cage coupled to the power drop board and configured to receive the modular power entry connector, wherein the conductive cage is configured to provide electro-magnetic shielding for the modular power entry connector.

15. A method to distribute power within a processing system assembly, comprising:
supplying power to a power connector coupled to a chassis through a power entry connector;
routing power from the power connector to a power drop board coupled to the power connector and having a plurality power couplers;
routing power from the power drop board to a power distribution board coupled to the chassis and configured as an open grid structure having board regions and open regions, the power distribution board having a plurality of power input connectors coupled to the plurality of power couplers for the power drop board; and
distributing power through the power distribution board from the plurality of power input connectors to a plurality of power output ports coupled to the plurality of power input connectors;
wherein the open regions comprise at least forty percent of a planar surface area for the power distribution board;
wherein the power distribution board is positioned within the chassis such that the open regions allow airflow to pass from a first internal portion of the chassis to a second internal portion of the chassis, the power distribution board being perpendicular to the airflow; and
wherein the power drop board is configured to extend in a plane perpendicular to a plane for the power distribution board.

16. The method of claim 15, wherein the open regions comprise at least seventy percent of the planar surface area for the power distribution board.

17. The method of claim 15, further comprising using a fan subsystem coupled to the chassis to facilitate airflow through the chassis and the power distribution board.

18. The method of claim 15, wherein the power distribution board is configured to help registration of one or more additional circuit boards.

19. The method of claim 15, further comprising routing power to at least one additional power drop board coupled to the power distribution board and to at least one additional power connector, and using the additional power drop board to provide redundant power supply.

20. The method of claim 15, wherein the power distribution board has power output ports on two opposing surfaces.

21. The method of claim 15, wherein the open grid structure comprises rectilinear board segments or curved board segments or both.

\* \* \* \* \*